(12) United States Patent
Zakel

(10) Patent No.: US 6,720,257 B1
(45) Date of Patent: Apr. 13, 2004

(54) BUMP WITH BASIC METALLIZATION AND METHOD FOR MANUFACTURING THE BASIC METALLIZATION

(75) Inventor: Elke Zakel, Falkensee (DE)

(73) Assignee: Pac Tech-Packaging Technologies GmbH, Nauen (DE)

( * ) Notice: Subject to any disclaimer, the term of this patent is extended or adjusted under 35 U.S.C. 154(b) by 0 days.

(21) Appl. No.: 09/937,955

(22) PCT Filed: Mar. 29, 2000

(86) PCT No.: PCT/DE00/00933

§ 371 (c)(1), (2), (4) Date: Sep. 28, 2001

(87) PCT Pub. No.: WO00/60649

PCT Pub. Date: Oct. 12, 2000

(30) Foreign Application Priority Data

Mar. 30, 1999 (DE) .......................................... 199 14 338

(51) Int. Cl.[7] ...................... H01L 21/4763; H01L 21/44
(52) U.S. Cl. ........................ 438/650; 438/614; 438/665; 438/677; 438/686
(58) Field of Search ................................. 438/614, 650, 438/665, 677, 686

(56) References Cited

U.S. PATENT DOCUMENTS 5,182,006 A    1/1993   Haydu et al.
6,028,011 A  * 2/2000   Takase et al. ................ 438/745

FOREIGN PATENT DOCUMENTS

| DE | 42 02 409   | 8/1992  |         |
|----|-------------|---------|---------|
| DE | 38 85 834   | 4/1994  |         |
| DE | 196 31 565  | 1/1998  |         |
| EP | 0 308 971   | 3/1989  |         |
| EP | 05331660    | 12/1993 |         |
| EP | 09283557    | 10/1997 |         |
| JP | 0630305532  | 12/1988 |         |
| JP | 02002132  * | 1/1990  | ........... H01L/21/60 |

OTHER PUBLICATIONS

"Low Cost Bumping Process for Flip Chip," Jean Audet et al., 1995 Flip Chip, BGA, TAB & AP Symposium, 1995, entire article.*

Jean Audet et al., 1995, *Low Cost Bumping Process for Flip Chip*, '95 Flip Chip, BGA, TAB & *AP Symposium* ©1995 Semiconductor Technology Center, Inc.

* cited by examiner

*Primary Examiner*—Carl Whitehead, Jr.
*Assistant Examiner*—Nema Berezny
(74) *Attorney, Agent, or Firm*—McGlew and Tuttle, P.C.

(57) ABSTRACT

A method for manufacturing a bump on a terminal face (Z1) of a semiconductor substrate (20), in which the terminal face is nucleated to generate a basic metallization through electrolytic coating of the terminal face with zincate, in such a way that zinc particles (24) electrolytically deposited on the terminal face serve as nuclei for an ensuing contact metallization (28) autocatalytically deposited on the basic metallization. In addition to the electrolytic coating with zincate, an electrolytic coating of the terminal face with palladium takes place, in such a way that, in addition to zinc particles (24), palladium particles (25) deposited on the terminal face serve as nuclei for the contact metallization subsequently autocatalytically deposited on the terminal face.

19 Claims, 6 Drawing Sheets

BUMP WITH BASIC METALLIZATION AND METHOD FOR MANUFACTURING THE BASIC METALLIZATION

FIELD OF THE INVENTION

This invention relates to a method for manufacturing a bump on a terminal face of a semiconductor substrate, in which the terminal face is nucleated to generate a basic metallization through electrolytic coating of the terminal face with zincate, in such a way that zinc particles electrolytically deposited on the terminal face serve as nuclei for an ensuing contact metallization autocatalytically deposited on the basic metallization. In addition, the invention relates to the structure of a bump with a basic metallization situated on a terminal face of a semiconductor substrate and a contact metallization situated on the basic metallization.

BACKGROUND OF THE INVENTION

It is known in the art for preparing semiconductor substrates for a subsequent bonding to provide the usually aluminum terminal faces of the semiconductor substrates with an elevated contact metallization; socalled "bumps". In particular when applying the contact metallization to the terminal faces through an autocatalytic deposition of metal, it has proven necessary, in order to improve the adhesion of the autocatalytically deposited metal to the terminal face, not to apply the contact metallization directly to the terminal face, but rather to provide a basic metallization between the terminal face and the contact metallization. This holds true in particular when the contact metallization consists of the autocatalytically deposited metals nickel and gold.

To improve adhesion between the autocatalytically deposited metals and the terminal face, it has proven beneficial to electrolytically coat the terminal face with zincate prior to autocatalytic deposition. The zincate or zinc in the zincate here preferably deposits at the grain boundaries of the relatively coarse-grained aluminum of the terminal face, and thereby produces a relatively coarse distribution of nuclei on the terminal face. This nucleation yields a good adhesion of a metal then autocatalytically deposited on the terminal face. However, the provided coarsely distributed nucleation only results in a correspondingly coarse-grained structure in the autocatalytically deposited metal. This relatively coarse structure facilitates the formation of structural defects, which ends up limiting the reliability of contact metallizations formed in this way.

It is known as an alternative to the electrolytic coating of the terminal faces with zincate to subject terminal faces to electrolytic coating with palladium in preparation for a subsequent autocatalytic metal deposition. The nucleation of the terminal faces achieved as a result has a significantly refined structure with a comparatively higher number of nuclei. This also enables a correspondingly fine-grained formation of the subsequently autocatalytically deposited metal structure. The disadvantage to a palladium nucleation, however, is that the pronounced catalytic property of palladium gives it only a limited selectivity, so that intensive nucleation with palladium can result in a deposition of palladium not just on the terminal faces, but also on the entire surface of the semiconductor substrate. In addition, a palladium nucleation only enables a slight adhesion to a subsequently autocatalytically deposited metallization in particular in comparison to zincate nucleation.

German Laid-Open Patent Specification DE 196 31 565 A1 describes a method in which improved contact metallizations are formed on the terminal faces of a chip by initially applying a flat zinc coating on the terminal face, after which the zinc layer applied in this way is covered with a flat palladium layer.

Patent, Abstracts of Japan No. 02002132 A describes a method for forming soldering bumps in which a flat intermediate layer comprised of a palladium/zinc alloy covering the terminal faces of a chip is formed on the terminal faces of the chip prior to the formation of the soldering bumps.

Patent Abstracts of Japan No. 09283557 A describes a method in which flat layers covering the terminal faces are applied prior to the formation of soldering bumps on the contact surfaces of a semiconductor substrate, wherein the layers each consist of three layers of varying materials. The three layers consist of a palladium/metal alloy layer, a nickel layer and another palladium/inetal alloy layer, wherein zinc, lead, arsenic, bismuth, tin, antimony, tellurium, nickel, cobalt, copper, iron, manganese, gold, quicksilver, silver, cadmium and sulfur are proposed as the metal.

EP 0 308 971 A2 describes a method in which an initial flat layer of palladium followed by a flat layer of nickel is applied to the contact surface prior to the formation of a soldering bump on the terminal face of a semiconductor substrate.

U.S. Patent Specification 5,182,006 describes a method for the formation of flat metal surfaces on zinc-coated aluminum substrates.

SUMMARY AND OBJECTS OF THE INVENTION

The object of this invention is to provide a method for manufacturing a bump with a contact metallization on the terminal face of a semiconductor substrate that makes it possible to further improve the quality of the contact metallization.

According to the invention, a method for manufacturing a bump on a terminal face of a semiconductor substrate is provided, in which the terminal face is nucleated to generate a basic metallization through electrolytic coating of the terminal face with zincate, in such a way that zinc particles electrolytically deposited on the terminal face serve as nuclei for an ensuing contact metallization autocatalytically deposited on the basic metallization. In addition to the electrolytic coating with zincate, an electrolytic coating of the terminal face with palladium takes place, in such a way that, in addition to zinc particles, palladium particles deposited on the terminal face serve as nuclei for the contact metallization subsequently autocatalytically deposited on the terminal face. The basic metallization is formed by numerous independent zinc particles and palladium particles. metallization subsequently autocatalytically deposited on the terminal face. The basic metallization is formed by numerous independent zinc particles and palladium particles.

In addition to the electrolytic coating of the terminal face with zincate, the method according to the invention enables an electrolytic coating of the terminal face with palladium, in such a way that palladium particles deposited on the terminal surface along with the zinc particles serve as nuclei for the contact metallization subsequently autocatalytically deposited on the terminal surface. The basic metallization takes the form of numerous independent zinc particles and palladium particles.

The combination of an electrolytic zincate coating and an electrolytic palladium coating according to the invention results in a hybrid nucleation, which yields a contact metallization that adheres well to the terminal face, and has a fine-grained structure along with a correspondingly smooth surface morphology. This produces a contact metallization with an increased reliability.

In a preferred variant of the method, the electrolytic coating of the terminal face with zincate (zincate coating) is performed in one method step, followed by the electrolytic coating of the terminal face with palladium (palladium coating) in a subsequent method step. In this variant, the subsequent palladium coating refines the nucleation structure produced by the zincate coating.

In particular having zincate coating take place at least partially after a palladium coating yields the advantageous effect that the relatively high erosion rate on the terminal face caused by the zincate coating is reduced by the comparatively low erosion rate of the palladium. This effect also has a beneficial effect on the surface morphology of the contact metallization, since an even greater surface smoothness can be achieved for the contact metallization.

One way to achieve this effect involves performing zincate coating not in a single method step, but interrupting zincate coating and interjecting a palladium coating, so that the zinc particles are at least partially removed prior to palladium coating, followed by repeated zincate coating.

Another possibility has to do with electrolytically coating the terminal face with palladium (palladium coating) in one method step, and electrolytically coating the terminal face with zincate (zincate coating) in an ensuing method step.

The refinement of the nucleation structure achievable with the preceding variant and concurrent refinement of the contact metallization structure can be increased even further by at least partially removing the zinc particles after the zincate coating, and then renewing the zinc coating process.

Hybrid nucleation followed by autocatalytic metal deposition that yields a contact metallization with especially good adhesion to the terminal face given a largely uniform surface morphology for the contact metallization becomes possible if a first electrolytic coating of the terminal face with zincate (zincate coating) takes place in a first method step, the electrolytic coating of the terminal face with palladium (palladium coating) takes place in a subsequent method step, and a second zincate coating takes place in another method step.

This variant also makes it possible to even further improve the surface morphology of the contact metallization by at least partially removing the zinc particles after the first zincate coating and before the palladium coating.

If the terminal face is nucleated in a combined electrolyte comprised of zincate and palladium ions, so that the electrolytic coating of the terminal face with zincate (zincate coating) and electrolytic coating of the terminal face with palladium (palladium coating) take place in a combined method step, so that zincate coating takes place simultaneously with palladium coating due to the combined or mixed electrolyte (zincate/palladium coating), it becomes possible to achieve a well adhering autocatalytically deposited contact metallization as well as a flat surface morphology based on only a single method step for nucleating the terminal face.

In one advantageous modification of this method variant at least a partial removal of the zinc particles with subsequent renewed zincate coating takes place after zincate/palladium coating.

As an alternative, it is also possible to have zinc ate/palladium coating be preceded by a zincate coating of the terminal face, followed by at least a partial removal of the zinc particles.

Stripping the zinc particles has proven to be particularly advantageous for at least partially removing the zinc particles.

Regardless of the method variant selected, the application of the method according to the invention as described above drawing reference to different variants results in a bump which has a basic metallization according to the invention with both zinc and palladium as constituents, wherein at least one constituent of the basic metallization takes the form of numerous mutually independent areas.

In the following, preferred variants of the method according to the invention will be described in greater detail based on the drawings.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENT

Figure 1:
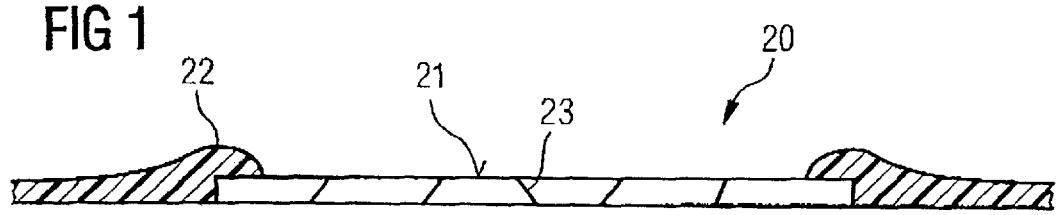
FIG. 1 is a sectional view of a semiconductor substrate with a terminal face arranged on a silicon body, initial state.

Referring to the drawings in particular, FIG. 1 shows a sectional view of a semiconductor substrate 20, e.g., a wafer or a chip, with a terminal surface 21 here made out of aluminum, whose circumferential boundary area is covered by a passivation layer 22 extending over the surface of the semiconductor substrate 20. It is emphasized that the following statements regarding method variants for nucleating the terminal surface 21 are not limited to the material of the terminal face 21 that was selected here as an example, i.e., aluminum.

Figure 2:
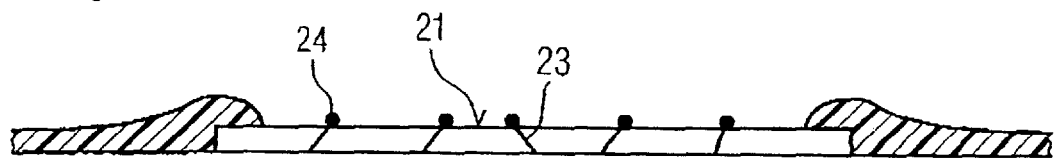
FIG. 2 is a sectional view of the terminal face shown in FIG. 1 after an electrolytic coating with zincate.

FIG. 2 shows the terminal face 21 after an electrolytic coating of the terminal face 21 with zincate. As evident, zinc particles or zinc grains 24 have electrolytically deposited preferably on the grain boundaries 23 of the terminal face material. Therefore, electrolytic deposition results in a relatively coarse distribution of zinc particles 24 on. t11e terminal face 21.

Figure 3:
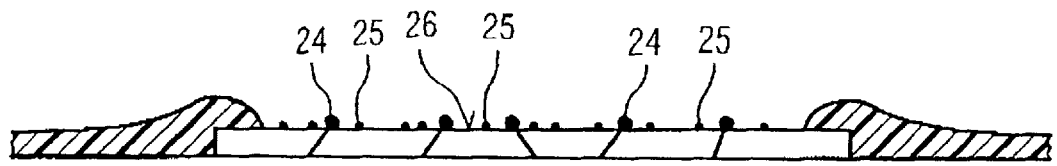
FIG. 3 is the terminal face shown in FIG. 2 after an electrolytic coating with palladium.

FIG. 3 shows the terminal face 21 after a second electrolytic coating with palladium following the first electrolytic coating with zinc. The palladium coating results in a relatively fine distribution of palladium particles or palladium grains 25 on the intermediate surfaces 26 of the terminal surface 21 remaining free after the zincate coating. Altogether, coating the terminal faces 21 with zincate and palladium therefore yields a relatively finely distributed arrangement of particles 24 and 25, which serve as deposition nuclei during a subsequent autocatalytic coating of the terminal face 21 with nickel.

Figure 4:
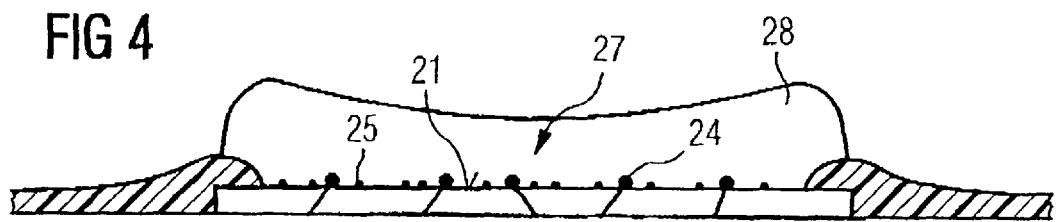
FIG. 4 is the terminal face shown in FIG. 3 after an autocatalytic deposition of nickel.

As shown in FIG. 4, the nucleation structure 27 that was finely structured through the interaction of zinc particles 24 and palladium particles 25 and encompasses the grain boundaries 23 of the terminal face material in conjunet1 on with the ensuing autocatalytic nickel deposition yields a uniform nickel coating 28 with a flat surface n-iorphology on the terminal to face 21.

Figure 5:
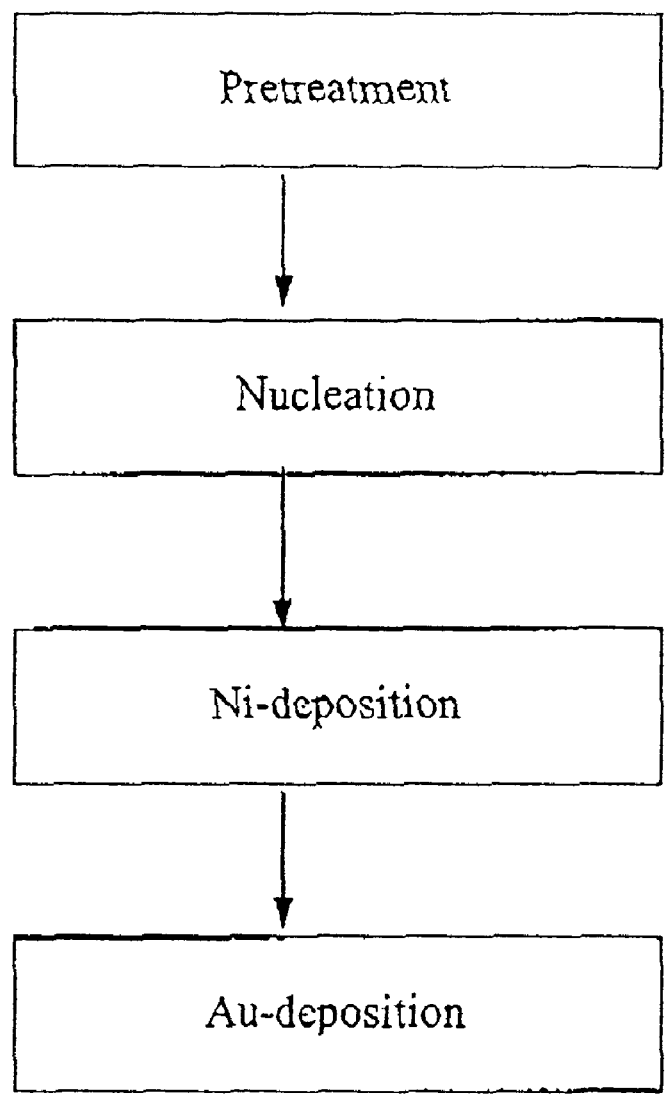
FIG. 5 is a diagrammatic representation of the method for generating an elevated contact metallization on a terminal face based on a nucleation of the terminal face.

As shown diagrammatically in FIG. 5, the process depicted in FIGS. 1 to 4 can be supplemented by a method step preceding nucleation, which involves a preliminary treatment of the terminal face 21 to remove the 15 oxide layer, and a method step following Ni deposition, in which the nickel coating 28 produced on the terminal, face 21 is additionally provided with an Au deposit also produced by way of autocatalytic deposition. In this case, the Ni deposit combines with the Au deposit to form the contact metallization.

Additional FIGS. 6 to 13 show preferred variants for nucleation via the electrolytic coating of the terminal face 21 of the semiconductor substrate 20 with zincate and palladium in diagrammatic form.

Figure 6:
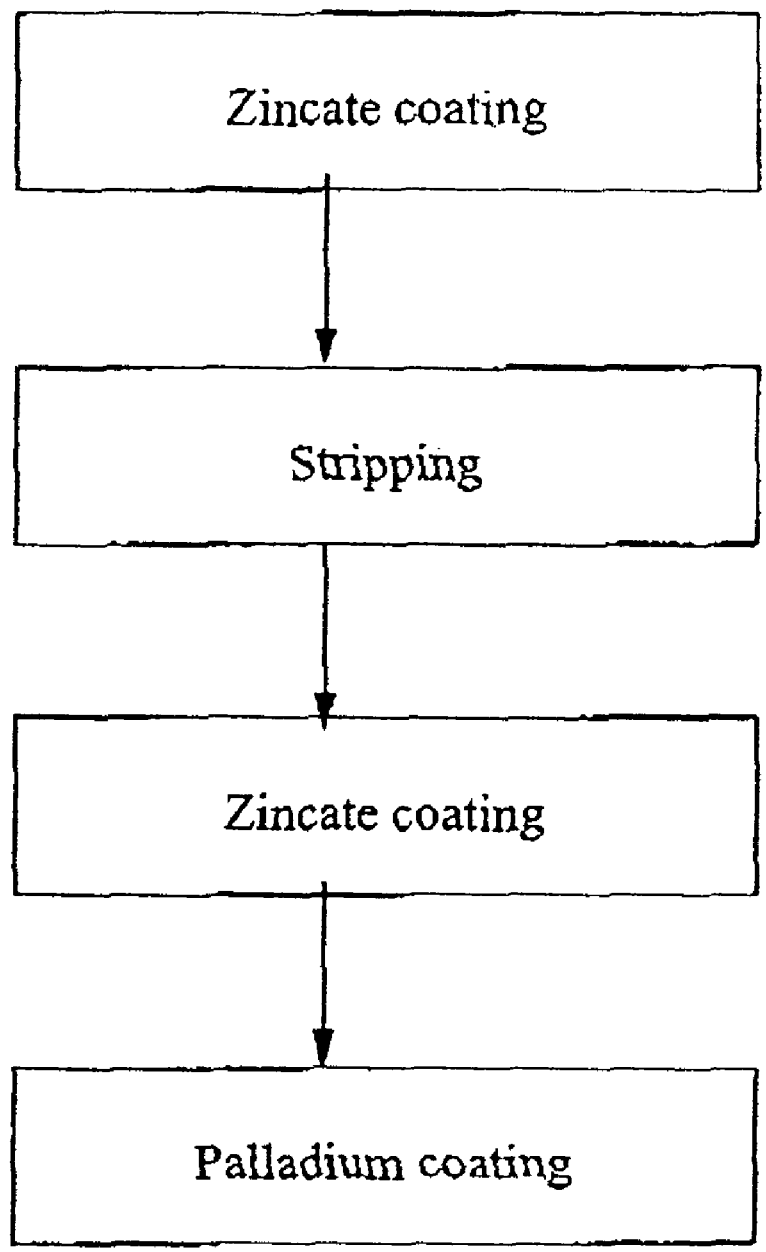
FIGS. 6 is a flow diagram showing a method variant for executing the nucleation process.

According to FIG. 6, the terminal face 21 is nucleated by first coating with zincate, then stripping the zinc grains electrolytically deposited on the terminal face 21 through zincate coating, repeating the zincate coating step and ending with a palladium coating step.

Figure 7:
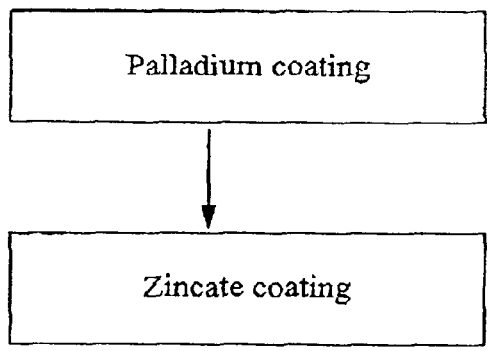
FIG. 7 is a flow diagram showing another method variant for executing the nucleation process.

According to FIG. 7, a first nucleation step involves palladium coating, followed in a second nucleation step by zincate coating the terminal face 21.

Figure 8:
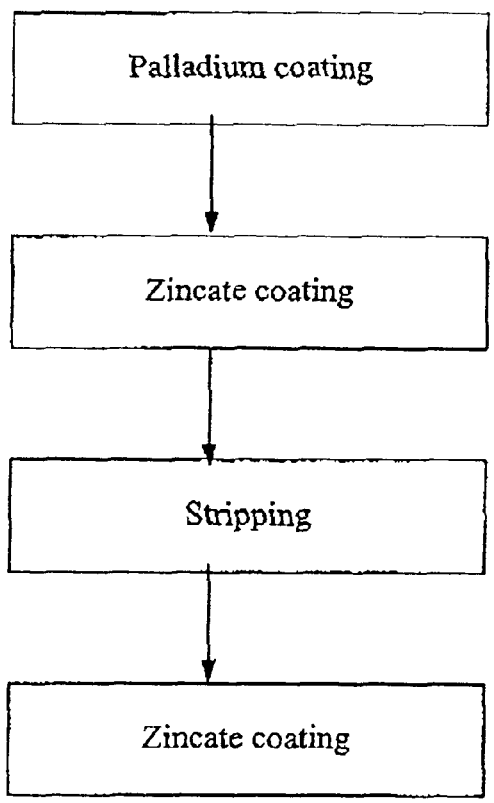
FIG. 8 is a flow diagram showing another method variant for executing the nucleation process.

According to FIG. 8, a first nucleation step involves a palladium coating of the terminal face 21, followed by a first zincate coating, a stripping of the zinc grains electrolytically deposited on the terminal face 21 in the first zincate coating step, and finally a second zincate coating step.

Figure 9:
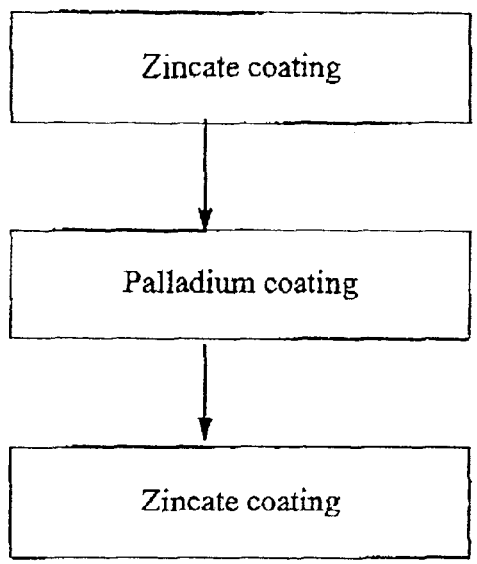
FIG. 9 is a flow diagram showing another method variant for executing the nucleation process.

According to FIG. 9, a first nucleation step involves a zincate coating of the terminal face 21, followed by a palladium coating, and finally a second zincate coating of the terminal face 21.

Figure 10:
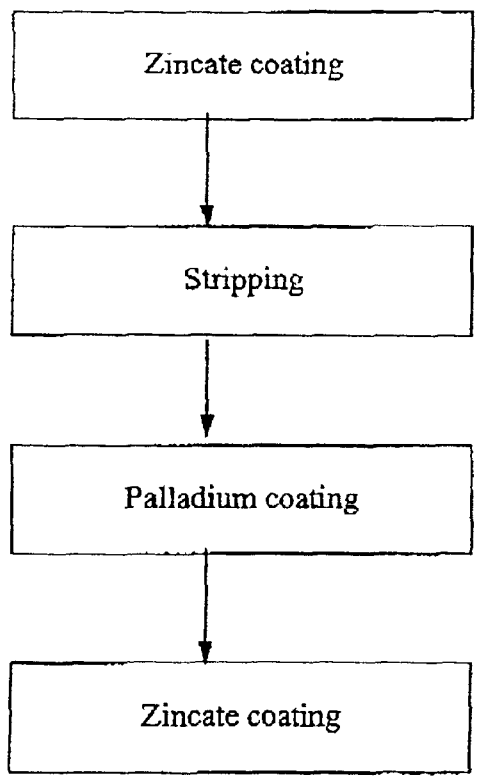
FIG. 10 is a flow diagram showing another method variant for executing the nucleation process.

According to FIG. 10, a first step for nucleating the terminal face 21 involves a first zincate coating, followed by a stripping of the zinc grains electrolytically deposited on the terminal face 21 through the first zincate coating, a palladium coating, and finally a second zincate coating of the 15 terminal face 21.

Figure 11:
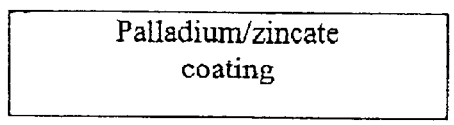
FIG. 11 is a flow diagram showing another method variants for executing the nucleation process.

According to FIG. 11, the terminal face 21 is nucleated in a single method step with a palladium/zincate coating by an electrolyte that has both palladium and zincate ions.

Figure 12:
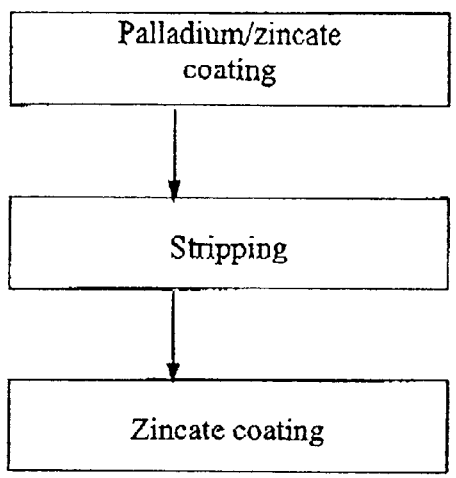
FIG. 12 is a flow diagram showing another method variant for executing the nucleation process.

According to FIG. 12, a first method step for nucleating the terminal face 21 involves a palladium/zincate coating, followed by a stripping of the zinc grains electrolytically deposited on the terminal face 21 through palladium-zincate coating, and finally a zincate coating of the terminal face 21.

Figure 13:
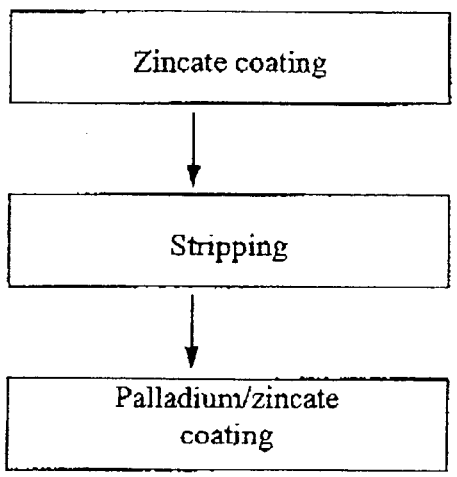
FIG. 13 is a flow diagram showing another method variant for executing the nucleation process.

According to FIG. 13, a first method step for nucleating the terminal face 21 initially involves a zincate coating, followed by a stripping of the zinc grains electrolytically deposited on the terminal face 21 through zincate coating, and finally a palladium/zincate coating of the terminal face 21.

While specific embodiments of the invention have been shown and described in detail to illustrate the application of the principles of the invention, it will be understood that the invention may be embodied otherwise without departing from such principles.

What is claimed is:

1. A method for manufacturing a bump on a terminal face of a semiconductor substrate, the method comprising:

nucleating the terminal face to generate a basic metallization through electrolytic coating of the terminal face with zincate such that zinc particles electrolytically deposited on the terminal face serve as nuclei for an ensuing adhesion between the contact metallization autocatalytically deposited on the basic metallization and the terminal face; and electrolyticly coating of the terminal face with palladium such that, in addition to the deposition of zinc particles, palladium particles are deposited on the terminal face and serve as nuclei for ensuring adhesion between the contact metallization subsequently autocatalytically deposited on the basic metallization and the terminal face, wherein the basic metallization is formed by numerous independent zinc particles and numerous independent palladium particles.

2. The method according to claim 1, wherein the electrolytic coating of the terminal face with zincate to form a zincate coating takes place in one method step, and the electrolytic coating of the terminal face with palladium to form a palladium coax takes place in a subsequent method step.

3. The method according to claim 2, wherein the palladium coating is preceded by at least a partial removal of the zinc particles followed by a renewed zincate coating.

4. The method according to claim 3, wherein the at least partial removal of zinc particles takes place via stripping.

5. The method according to claim 1, wherein the electrolytic coating of the terminal face with palladium to form a palladium coating takes place in one method step, and the electrolytic coating of the terminal face with zincate to form a zincate coating takes place in a subsequent method step.

6. The method according to claim 5, wherein the zincate coating is followed by an at least partial removal of the zinc particles followed by a renewed zincate coating.

7. The method according to claim 6, wherein the at least partial removal of zinc particles takes place via stripping.

8. The method according to claim 1, wherein a first electrolytic coating of the terminal face with zincate to form a zincate coating takes place in a first method step, the electrolytic coating of the terminal face with palladium to form a palladium coating takes place in a subsequent method step, and a second zincate coating takes place in another method step.

9. The method according to claim 8, wherein at least a partial removal of the zinc particles takes place after the first zincate coating and before the palladium coating.

10. The method according to claim 9, wherein the at least partial removal of zinc particles takes place via stripping.

11. The method according to clam 1, wherein the electrolytic coating of the terminal face with zincate to form a zincate coating and electrolytic coating of the terminal face with palladium to form a palladium coating take place in a single method step, in such a way that the zincate coating occurs simultaneously with the palladium coating via a mixed electrolyte zincate and palladium coating.

12. The method according to claim 11, wherein the mixed electrolyte zincate and palladium coating is followed by at least a partial removal of the zinc particles, followed by a renewed zincate coating of the terminal face.

13. The method according to claim 12, wherein the at least partial removal of zinc particles takes place via stripping.

14. The method according to claim 11, wherein the mixed electrolyte zincate and palladium coating is preceded by a zincate coating of the terminal face, followed by an at least a partial removal of the zinc particles.

15. The method according to claim 14, wherein the at least partial removal of zinc particles takes place via stripping.

16. A bump with a basic metallization situated on a terminal face of a semiconductor substrate and a contact metallization situated on the basic metallization, wherein the basic metallization has zinc and palladium as constituents each serving as nuclei for ensuring adhesion between the contact metallization autocatalytically deposited on the basic metallization nd the terminal face and at least one constituent of the basic metallization is formed as numerous mutually independent areas.

17. A method for manufacturing a bump on a terminal face of a semiconductor substrate, the method comprising:

electrolyticly seeding of the terminal face with zincate such that numerous independent zinc particles are electrolytically deposited on the terminal face;

electrolyticly seeding of the terminal face with palladium such that, in addition to the deposition of zinc particles, numerous independent palladium particles are deposited on to terminal face, said steps of electrolytically seeding with zincate and electrolytically seeding with palladium taking place as sucessive steps, one following the other; and subsequent to said steps of electrolyticly seeding of the terminal face with zincate and electrolyticly seeding of the terminal face with palladium, autocatalytically depositing a contact metallization on the terminal face, wherein a basic metallization is formed by the numerous independent zinc particles and the numerous independent palladium particles serving as nuclei for the contact metallization, with the numerous independent zinc particles and numerous independent palladium particles nucleating the terminal ice to generate the basic metallization to provide adhesion between the contact metallization and the terminal face.

18. The method according to claim 17, wherein the electrolytic seeding of the terminal face with zincate to form the numerous independent zinc particles takes place in one method step, and the electrolytic seeding of the terminal face with palladium to form the numerous independent palladium particles takes place in a subsequent method step.

19. The method according to claim 17, wherein the electrolytic seeding of the terminal face with palladium to form the numerous independent palladium particles takes place in one method step, and the electrolytic seeding of the terminal face with zincate to form the numerous independent zinc particles takes place in a subsequent method step.

* * * * *